United States Patent [19]

Kawanami et al.

[11] Patent Number: 5,065,034
[45] Date of Patent: Nov. 12, 1991

[54] CHARGED PARTICLE BEAM APPARATUS

[75] Inventors: Yoshimi Kawanami, Fuchu; Tsuyoshi Ohnishi, Kokubunji; Tohru Ishitani, Sayama; Tooru Habu, Kanagawa; Masahiro Yamaoka, Hachioji, all of Japan

[73] Assignee: Hitachi, Ltd., Tokyo, Japan

[21] Appl. No.: 517,313

[22] Filed: May 1, 1990

[30] Foreign Application Priority Data

May 10, 1989 [JP] Japan ................................. 1-114922

[51] Int. Cl.[5] ............................................. H01J 3/12
[52] U.S. Cl. ................................ 250/505.1; 250/492.2
[58] Field of Search ............. 250/492.23, 491.1, 505.1, 250/398

[56] References Cited

U.S. PATENT DOCUMENTS

| 3,466,487 | 9/1969 | Davis et al. | 250/505.1 |
| 3,736,425 | 5/1973 | Chermon | 250/491.1 |
| 4,055,770 | 10/1970 | Milcamps et al. | 250/505.1 |
| 4,207,489 | 6/1980 | Camplan et al. | 250/505.1 |
| 4,445,040 | 4/1984 | Iwasaki et al. | 250/492.23 |
| 4,899,060 | 2/1990 | Lischke | 250/505.1 |

OTHER PUBLICATIONS

Journal of Vacuum Science Technology, vol. B4(1), Jan./Feb. 1986, "Maskless Ion Beam Writing of Precise Doping Patterns With Be and Si for Molecular Beam Epitaxially Grown Multilayer GaAs", E. Miyauchi et al., pp. 189–193.

Primary Examiner—Bruce C. Anderson
Attorney, Agent, or Firm—Fay, Sharpe, Beall, Fagan, Minnich & McKee

[57] ABSTRACT

A charged particle beam apparatus is provided with an aperture device which includes a plurality of slit plates. Each of the slit plates includes a plurality of slits having different widths. The slit plates are superimposed in a direction of the axis of a charged particle beam so that the corresponding slits in the slit plates overlap to define an aperture which controls a beam current.

31 Claims, 10 Drawing Sheets

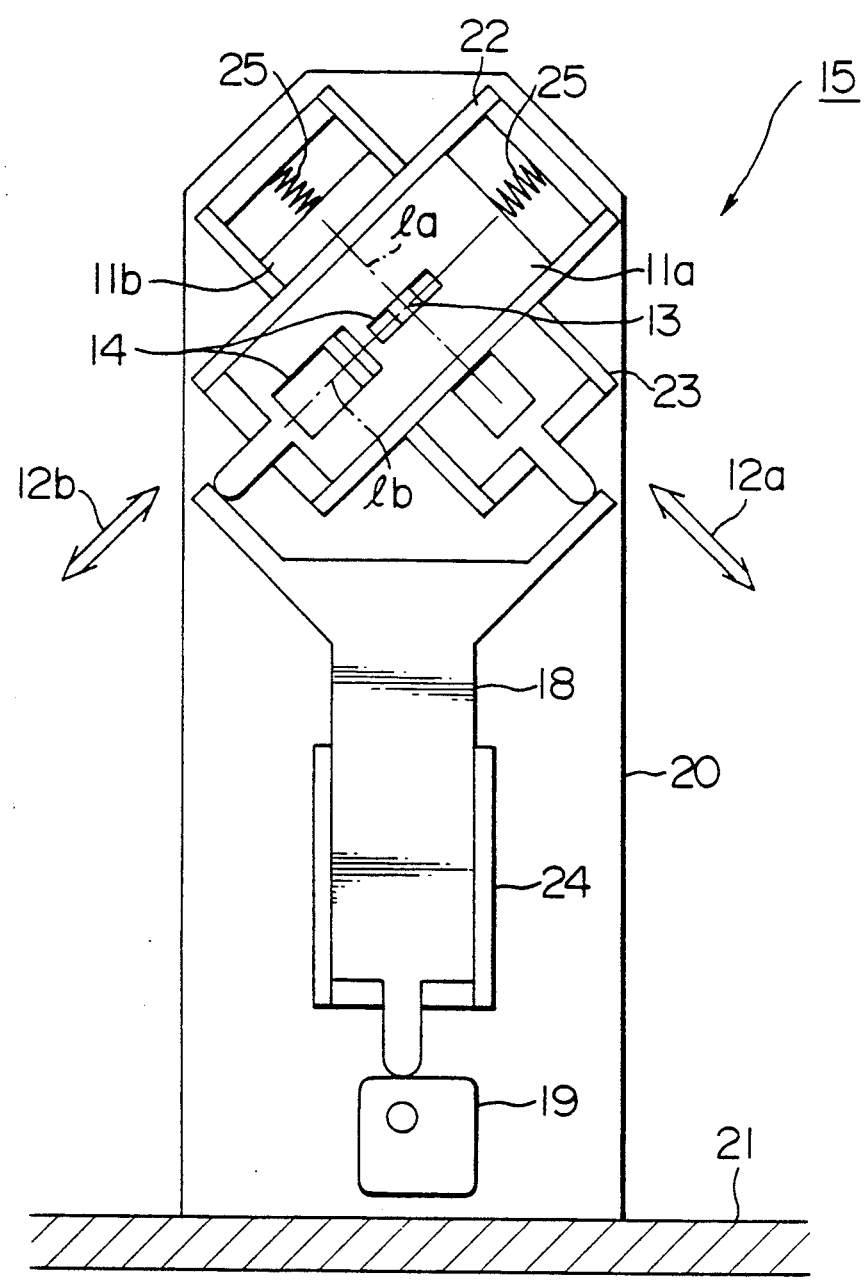

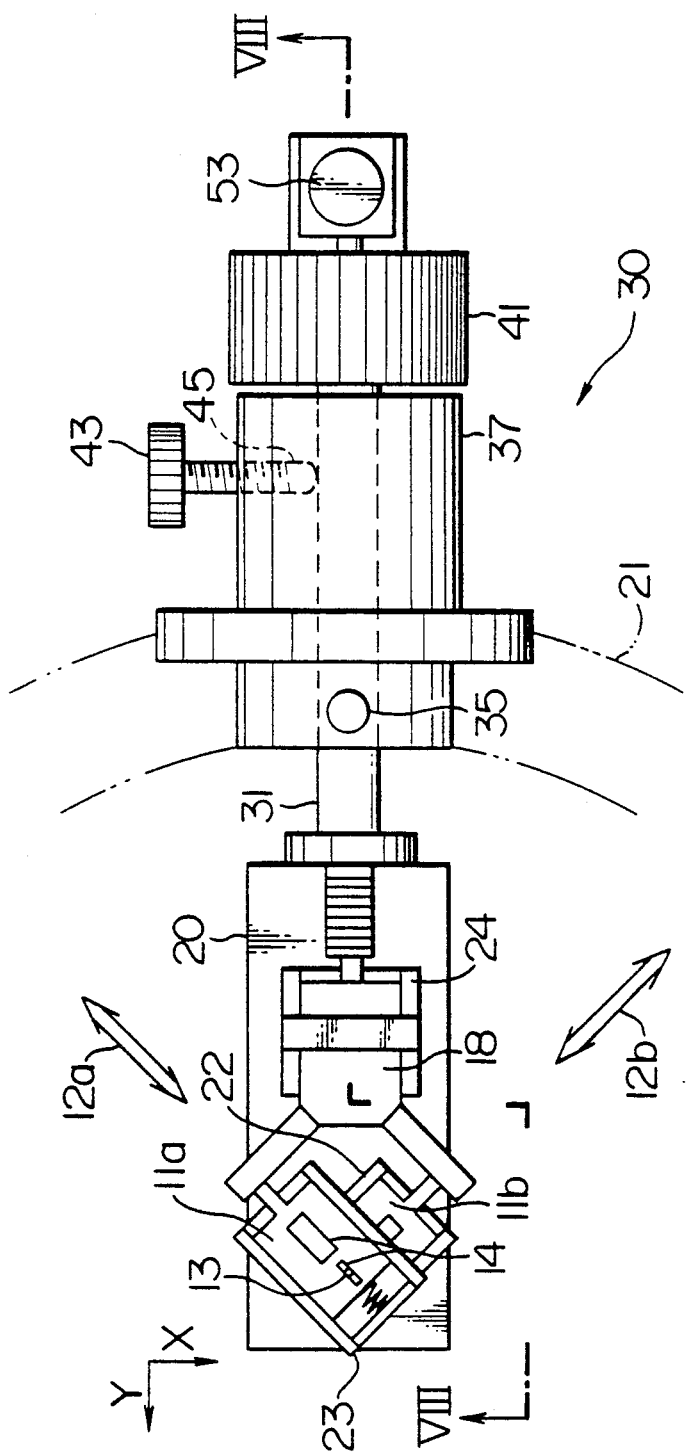

CHARGED PARTICLE BEAM APPARATUS

BACKGROUND OF THE INVENTION

The present invention relates to an apparatus for irradiating a specimen with a beam of charged particles such as ions or electrons.

The following explanation of a charged particle beam apparatus will be made taking a focused ion beam apparatus by way of example. A focused ion beam apparatus includes a high-intensity ion source such as a liquid metal ion source and an ion optical system for focusing and deflecting ions to irradiate any given position on a specimen with a beam of ions. The ion source and the ion optical system are provided in a vacuum vessel. The conventional focused ion beam apparatus is discussed by, for example, J. Vac. Sci. Technol. B4 (1), 1986, pp. 189-193.

The above reference discloses a focused ion beam apparatus which has a basic structure as shown in FIG. 1. Electrostatic lenses 3a and 3b form an image of an ion source 1 on a specimen 6. The diameter of an ion beam 2 on the specimen is mainly determined by the aberration of the electrostatic lenses and depends upon the spread angle of an ion beam on the specimen. Accordingly, a beam current and the beam diameter can be changed by selecting a proper aperture of a beam current limiting aperture plate 5, including a plurality of apertures 10, the sizes of which are different. Namely, a proper one of the apertures 10 is selected by moving the aperture plate 5 in a left/right direction in FIG. 1 by means of a known fine adjustment or movement mechanism. However, in thus selecting the aperture, usually the center of the aperture deviates from a beam axis due to a minute error associated with the fine adjustment mechanism of the aperture plate 5, thereby increasing the aberration so that a beam distribution on the specimen asymmetrically spreads, as shown in FIG. 2. Therefore, it is necessary to carry out the complicated fine adjustment of the aperture position for several ten seconds to several ten minutes every time there is an aperture change, while judging the beam distribution by virtue of an image of secondary electrons emitted from the specimen irradiated with the ion beam. In FIG. 1, reference numeral 4 designates an electrostatic deflector for deflecting the ion beam 2, numeral 8 a secondary-electron detector for detecting secondary electrons emitted from the specimen 6, and numeral 7 a specimen stage for holding the specimen 6 thereon and providing a small movement to the specimen 6.

In the above prior art, though it is possible to change the beam current and the beam diameter of the ion beam with which the specimen is irradiated, the execution of such change in a short time is difficult since the complicated aperture positioning is required.

SUMMARY OF THE INVENTION

An object of the present invention is to provide a focused charged particle beam apparatus having an aperture mechanism by which the change of a beam current and a beam diameter can be effected at a high speed.

To attain the above object, a charged particle beam apparatus according to the present invention includes a beam current limiting mechanism having a plurality of slit plates each including a plurality of slits the widths of which are substantially equal to desired aperture diameters and the lengths of which are larger than the desired aperture diameters. The slit plates are superimposed in a direction of the axis of a beam and moving means moves each slit plate in the longitudinal direction of the slits of that slit plate in a plane orthogonal to the beam axis with the slits intersecting the beam so that predetermined or corresponding slits in the slit plates overlap to form a desired aperture.

A specific function of the charged particle beam apparatus of the present invention having the above construction will be explained by use of FIGS. 3a and 3b which are schematic plan views of the beam current limiting mechanism. Two slit plates 11a and 11b have the same configuration, each includes two slits 14 disposed on a virtual trajectory 1a or 1b and having different widths. At an initializing step, slit plates 11a, 11b are superimposed so that one pair of the slits 14 in the slit plates 11a and 11b having the same width form a rectangular aperture 13 centering around the beam axis, as shown in FIG. 3a. As apparent from FIG. 3a, the size of the aperture 13 is determined by the width of the slit 14. This aperture is used as a beam current limiting aperture which limits the spread angle of the beam on a specimen to determine a beam current and a beam diameter.

When the size of the aperture 13 is to be changed, the slit plates 11a and 11b are stepwise moved by a distance equal to a distance between the centers of the wider and narrower slits in the longitudinal directions 12a and 12b of the slits, that is, with the virtual trajectories 1a and 1b always intersecting the beam axis. Thereby, the wider slits 14 overlap to form a larger aperture 13, as shown in FIG. 3b.

The slit plates 11a and 11b move in only the longitudinal directions 12a and 12b of the slits and do not move in the other directions. Accordingly, any movement error appears in only the longitudinal direction of the slit 14. However, the size of the aperture 13 is determined by only the width of the slit 14. Therefore, so long as the slits 14 overlap, the size of the aperture is kept constant even under the presence of any movement error and there is no fear that the position of the aperture deviates from the beam axis. As a result, a precision required for the movement of each of the slit plates 11a and 11b is low and it is therefore possible to move the slit plates rapidly.

BRIEF DESCRIPTION OF THE DRAWINGS

FIG. 5 is a plan view of an aperture device or beam current limiting mechanism in the apparatus shown in FIG. 4;

FIG. 7 is a plan view of a fine adjustment mechanism which is applied to a second embodiment of the present invention;

DESCRIPTION OF THE PREFERRED EMBODIMENTS

Embodiments of the present invention will now be explained by use of the accompanying drawings.

EMBODIMENT 1

Figure 4:
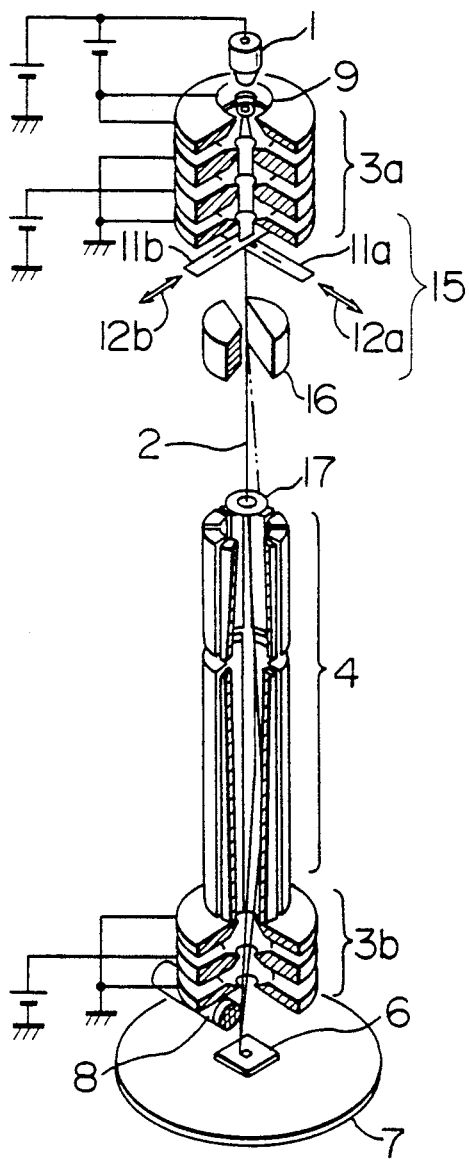
FIG. 4 is a perspective view showing the schematic construction of a focused ion beam apparatus according to an embodiment of the present invention.

FIG. 4 is a perspective view showing the schematic construction of a focused ion beam apparatus according to an embodiment of the present invention. Ions emitted from a source 1 of liquid metal (Ga) ions are focused as an ion beam 2 onto a specimen 6 by two stages of electrostatic lenses 3a and 3b. The specimen 6 is irradiated at any given position thereof with the ion beam 2 by a two-stage electrostatic deflector 4. The spread angle of the ion beam on the specimen is limited by a beam current limiting mechanism 15 disposed below the electrostatic lens 3a. Secondary electrons emitted from the specimen are detected by a secondary-ion detector 8. The beam current limiting mechanism 15 may be disposed below the objective lens 3b as in the conventional apparatus.

FIG. 5 shows the beam current limiting mechanism or aperture device 15 in the present embodiment. In the present embodiment, slit plates 11a and 11b have substantially the same configuration and are respectively held in guides 22 and 23 so that they are movable in only the longitudinal directions of slits 14. The guides 22 and 23 are parallel to orthogonal virtual trajectories 1a and 1b and are fixed on a supporting plate 20. The supporting plate 20 is fixed at one end portion thereof to a vacuum vessel 21 and has at the other end portion thereof an opening for passing the beam therethrough. With such a construction, the slit plates 11a and 11b can be stably moved in constant directions while the virtual trajectories 1a and 1b thereof always intersect the beam.

Each slit 14 has opposite longer sides along the direction of movement 12a or 12b of the slit plate 11a or 11b or the direction of the virtual trajectory 1a or 1b, with the virtual trajectory 1a or 1b being sandwiched therebetween, and an interval between the opposite longer sides of the slit 14 is constant which makes the opposite longer sides of a slit 14 parallel. Shorter sides of the slit 14 have a length corresponding tp the width of the slit, which width is defined corresponding to the diameter of a desired aperture 13. No restriction to the length of the longer side or length of the slit is made so long as it is larger than the predetermined aperture diameter. However, the length of the slit is preferably about two or fourty times as large as the width of the slit from a viewpoint that an error of movement of the slit plate 11a or 11b in the direction of the virtual trajectory 1a or 1b can be absorbed and an aperture change-over time can be shortened by making a distance between adjacent slits small.

Figure 6A:
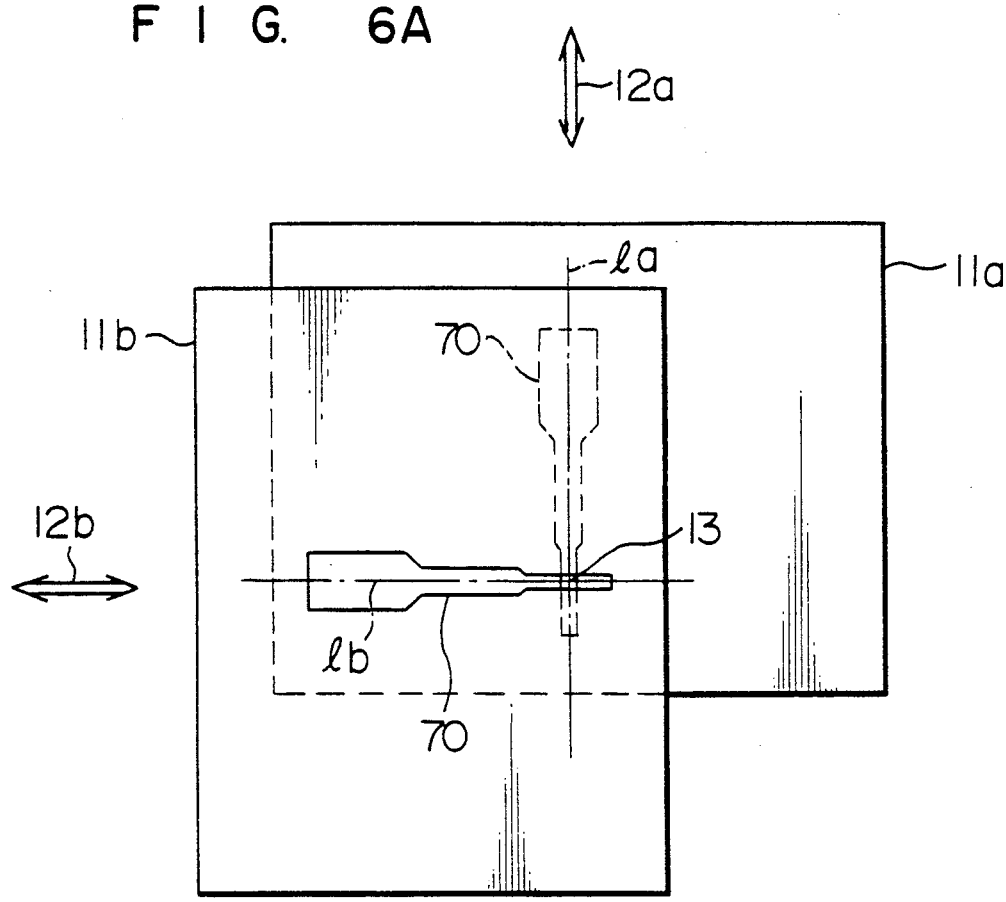
FIGS. 6A and 6B are plan views showing a modified configuration of slits.
Figure 6B:
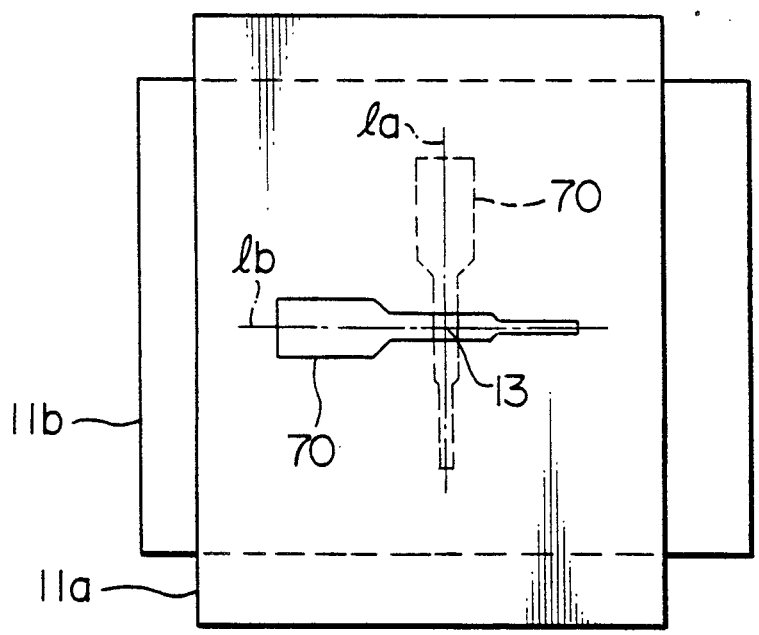

In the aperture device 15 shown in FIG. 5, a wider slit and a narrower slit have been formed discontinuously or discretely. Alternatively, such slits may be formed continuously or contiguously as shown in FIGS. 6a and 6b. Each of slit plates 11a and 11b shown in FIGS. 6a and 6b includes a slit 70 having three different widths.

In the foregoing explanation and illustration, the aperture device 15 has been shown in which two slit plates having the same configuration are superimposed orthogonally. However, it does not necessarily follow that the slit plates are superimposed orthogonally. Also, the widths of the slits overlapping so as to form the aperture 13 may be different. Further, three or more slit plates may be superimposed. But, an aperture formed by the slits should optimumly have a shape which is symmetrical with respect to the beam axis. More optimumly, it should be a regular polygon. Furthermore, a slit may be provided which extends from the periphery of a slit plate.

The slit plates 11a and 11b shown in FIG. 5 abut against a push plate 18 which is moved by a cam 19 operated from the outside of the vacuum vessel 21. Reference numeral 25 designates compression coil springs which have their functions of always energizing or pushing or biasing the slit plates 11a and 11b to or against the push plate 18. Numeral 24 designates a guide for guiding the push plate 18. In the thus constructed aperture mechanism of the present embodiment, the slit plates 11a and 11b reciprocate in directions of arrows 12a and 12b at a constant pitch which is determined by the shape of the cam 19 (and is substantially equal to the pitch of the slits 14). In this case, the movement of the slit plates 11a and 11b indirections other than the directions 12a and 12b is limited by the guides 22 and 23. Accordingly, even if the slit plates 11a and 11b are moved to select a slit pair, the selected slits 14 always intersect the beam and the position of the aperture 13 formed by the overlapping of the corresponding slits 14 is always registered with the beam. Since each slit 14 has a sufficient length in a direction along the virtual trajectory 11a or 11b, the position and size of the aperture 13 have almost no change even if there is an error in the dimensions of the push plate 18 and/or the cam 19.

An experiment in which the change of the size of the beam current limiting aperture 13 is continuously repeated 100 times was conducted for the aperture mechanism 15 in the case where the sizes of two kinds of slits are 1 mm $\times$ 30 $\mu$m and 1 mm $\times$ 150 $\mu$m. As the results of the experiment, a time required for one change was about 0.1 seconds, the positioned deviation of the beam on the specimen was not larger than 0.05 $\mu$m and no beam blooming or blurring was observed. Also, a beam current and a beam diameter obtained by an accelerating voltage of 30 KV were 100 pA and 0.1 $\mu$m for a smaller aperture and 2.5 nA and 0.5 $\mu$m for a larger aperture.

Figure 1:
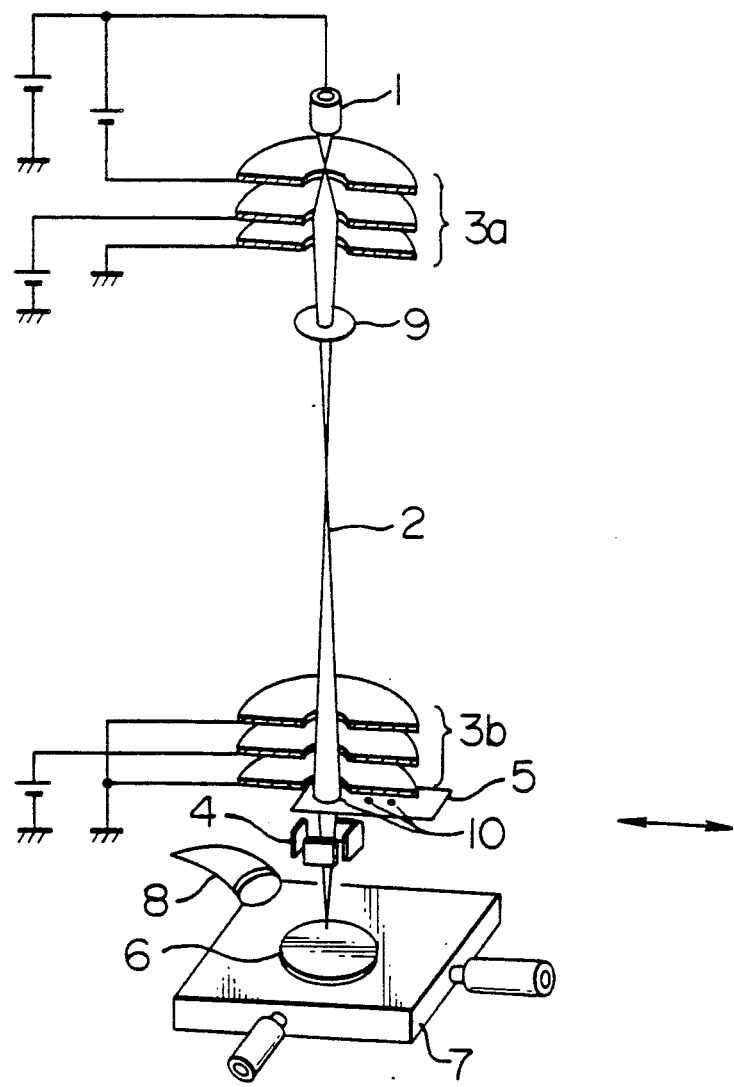
FIG. 1 is a perspective view showing the schematic construction of the conventional charged particle beam apparatus.
Figure 2:
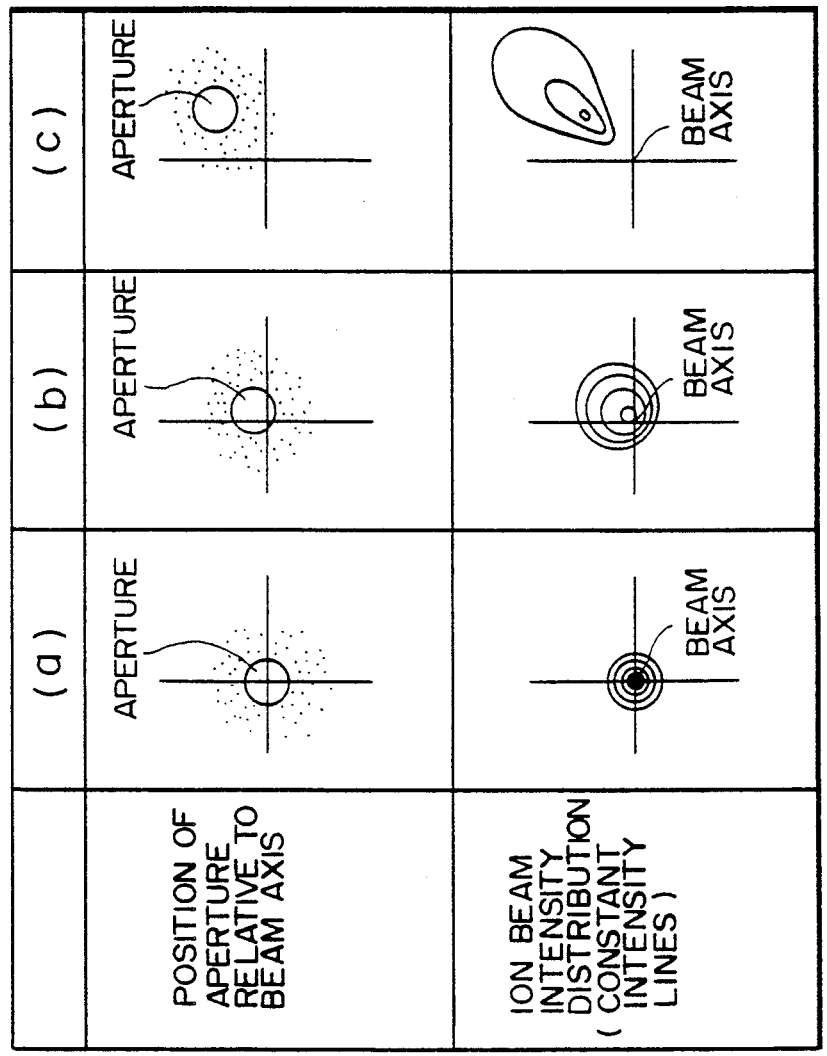
FIG. 2 is a view for explaining a relation between the position of a beam current limiting aperture and a beam intensity distribution on a specimen corresponding to the aperture position in the case of the conventional charged particle beam apparatus.
Figure 3A:
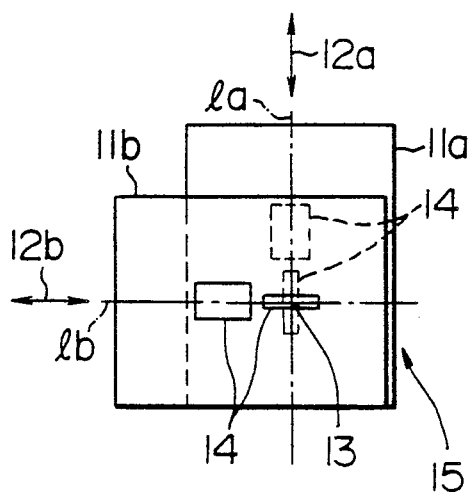
FIGS. 3A and 3B are plan views of a beam current limiting mechanism for explaining the operation of the present invention.
Figure 3B:
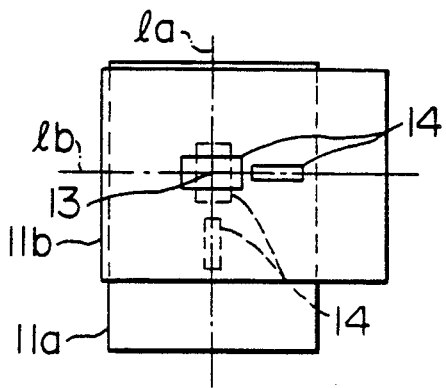

The apparatus shown in FIGS. 4 and 5 was used for an experiment in which an Al line having a width of and a thickness of 2 $\mu$m was cut at ten locations by means of a sputter processing having a cutting width of 2 $\mu$m. The detection of a position on a specimen subjected to the sputter processing was made by use of an image of secondary electrons obtained by a raster scan of an ion beam and detected by the secondary-electron detector 8. The beam current limiting aperture was changed such that an ion beam current upon observation of the image of the specimen is made small for reducing of the specimen and improving the precision of detection, and an ion beam current upon sputter processing is made large for shortening a processing time. As the result of the experiment, the total processing time was 20 minutes (and the total beam change time was one second). On the other hand, in the case where a similar processing was conducted by use of the conventional aperture mechanism having the construction shown in FIG. 1, 10 minutes was required for beam change or attainment of the axial alignment of the aperture and the beam with each other. Also, when a smaller beam diameter for observation is used for the formation of a pattern as it is, a time for axial alignment is not required but 30 minutes were required for forming the pattern. The above results are shown in Table I.

TABLE I

| | | BEAM DIAMETER UPON OBSERVATION | BEAM DIAMETER UPON FORMATION OF PATTERN | TIME FOR FORMATION OF PATTERN | TIME FOR AXIAL ALIGNMENT | TOTAL PROCESSING TIME |
|---|---|---|---|---|---|---|
| PRIOR ART | ① | small | large | 20 minutes | 10 minutes | 30 minutes |
| | ② | small | small | 30 minutes | 0 minute | 30 minutes |
| EMBODIMENT | | small | large | 20 minutes | 1 second | 20 minutes |

An experiment was conducted using the apparatus shown in FIGS. 4 and 5 in which a silicon wafer (specimen) coated with a resist film was irradiated with a focused ion beam to expose the resist film to a simple line pattern. A pattern including lines having different widths was grouped into wider lines and narrower lines and the exposure was made changing the size of the beam current limiting aperture in accordance with the line group to optimize a beam current and a beam diameter. In changing the size of the beam current limiting aperture by stepwise moving the slit plates, the ion beam 2 was blanked out for the specimen 6 by a blanking electrode 16 and a blanking aperture 17 during a period of time when the slit plates were stepwise moved. Thereby, the irradiation of the specimen with the ion beam was avoided during a period of time when a beam current and a beam diameter are not settled. In the conventional apparatus, on the other hand, in the case where an aperture for the formation of the narrower lines is used for the formation of the wider lines as it is, an exposure time (or total processing time) was about 1.4 times as long as that in the present embodiment. A method of carrying out the exposure while changing the size of the aperture in accordance with the line width cannot be employed practically in the conventional apparatus since a time of about 10 minutes is required for every change of the aperture size.

In the apparatus shown in FIGS. 4 and 5, since the liquid metal ion source 1 became unstable so that the ion current was decreased, a flashing operation which causes an abrupt increase of the ion current was performed to stabilized the ion current. A large amount of neutral particles are emitted from the ion source upon flashing of the ion source, the contamination of the specimen 6 could be prevented by superimposing the two slit plates of the beam current limiting mechanism 15 at their regions including no slit so that they are used as a beam shutter to shield the ions and neutral particles.

EMBODIMENT 2

Figure 8:
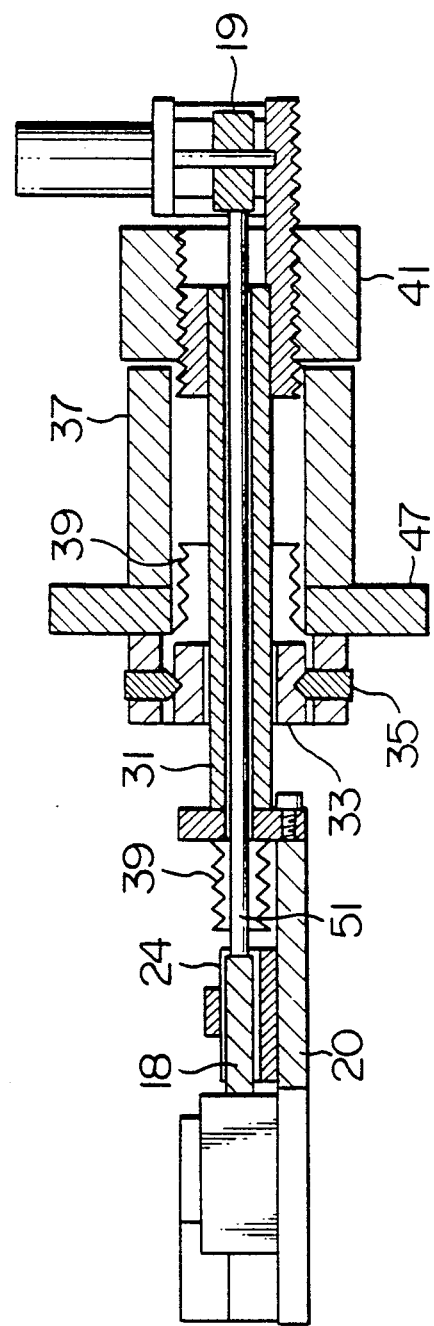
FIG. 8 is a longitudinal cross section of the fine adjustment mechanism taken along line VIII—VIII in FIG. 7.

The present embodiment is characterized in that a fine adjustment or movement mechanism 30 for allowing fine adjustment of a position of the supporting plate 20 in a horizontal direction (X and Y directions in FIG. 7) is additionally provided in the apparatus shown in conjunction with the first embodiment. FIG. 7 is a plan view of the fine adjustment mechanism 30 and FIG. 8 is a cross section taken along line VIII—VIII in FIG. 7.

The fine adjustment mechanism 30 includes a hollow rod 31, a collar 33, pins 35, an outer casing 37, metal bellows 39, a Y-direction knob 41 and an X-direction knob 43.

The supporting plate 20 is coupled to a left end of the hollow rod 31 and a right end of the hollow rod 31 is engaged with the Y-direction knob 41 in a screw pair fashion. The hollow rod 31 is brought into an idle engagement with the collar 33 and the collar 33 is pivotally supported by a left end of the outer casing 37 through the pins 35. Accordingly, the hollow rod 31 can oscillate around the pins 35 or the collar 33 in the X-direction. The X-direction knob 43 has an X-direction screw 45 which is threaded through the outer casing 37 and is coupled to the right end of the hollow rod 31. The supporting plate 20 coupled to the left end of the hollow rod 31 makes a small movement in the X-direction by moving the screw 45 in and out of the outer casing 37. A vacuum flange 47 protruded from the peripheral surface of the outer casing 37 is attached to the vacuum vessel 21. The metal bellows 39 are provided for maintaining a vacuum condition of the vessel 21.

In association with the use of the fine adjustment mechanism 30 having the above construction, a rod 51 protruded from the push plate 18 is passed through the hollow rod 31 and is brought into an abutment against the cam 19. In FIGS. 7 and 8, reference numeral 53 designates a motor for rotating the cam 19.

EMBODIMENT 3

Figure 9:
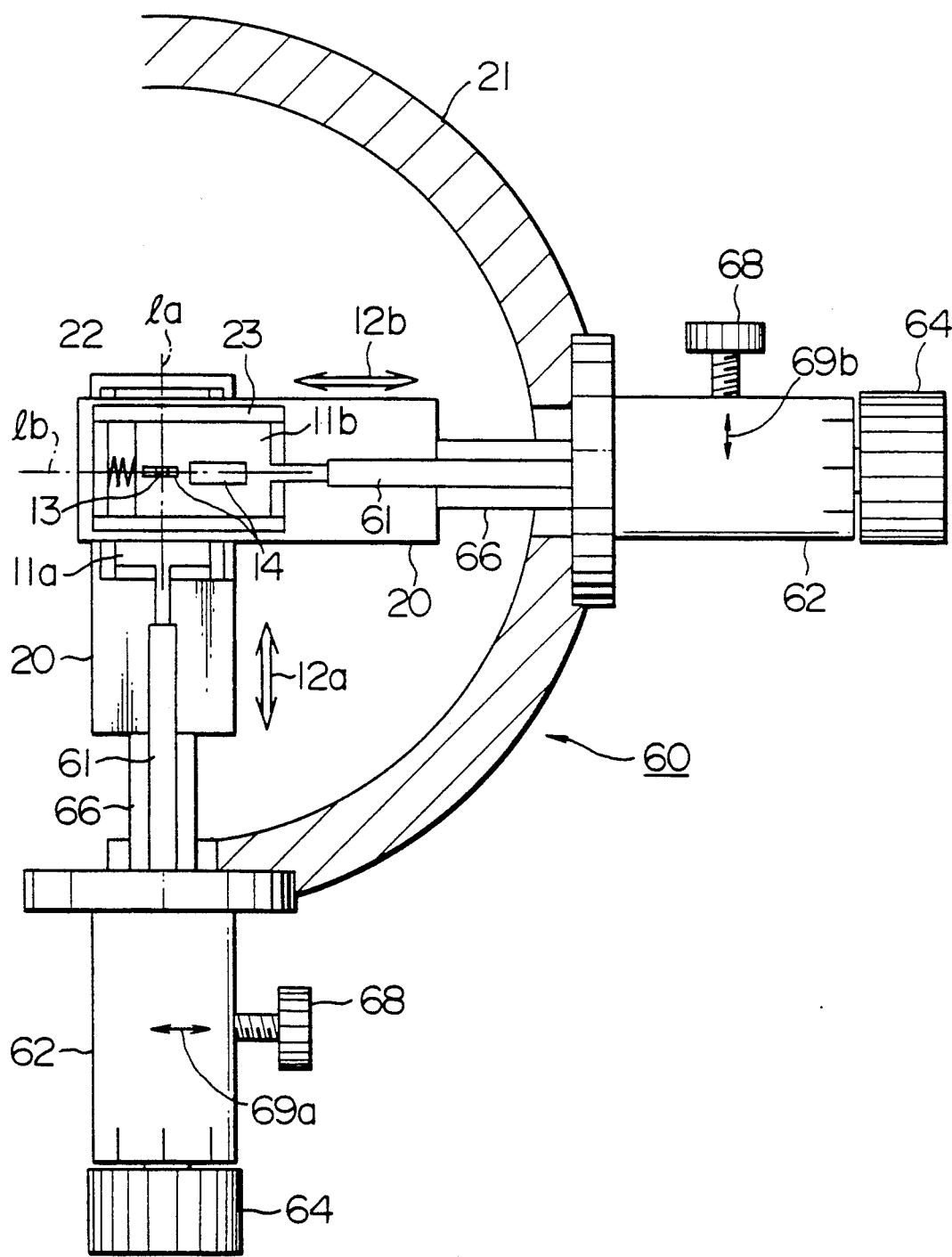
FIG. 9 is a view for explaining the construction of an aperture device which is applied to a third embodiment of the present invention.

The present embodiment is also characterized by an aperture device 60 as shown in FIG. 9. The aperture device 60 includes two supporting plates 20 on which slit plates 11a and 11b are respectively provided through guides 22 and 23. A rod 61 is coupled to each of the slit plates 11a and 11b. Each rod 61 thrusts through the wall of a vacuum vessel 21 and is engaged with a stepping movement knob 64 as first moving means attached to one end of an outer casing 62. The engagement of the rod 61 with the knob 64 is made in a screw pair fashion, like the engagement of the hollow rod 31 with the Y-direction knob 41 shown in FIG. 8. Plates 66 are coupled to the supporting plates 20 and are inserted into the outer casings 62. The plates 66 make their small movements in directions of arrows 69a and 69b by virtue of lateral fine adjustment mechanism 68 as second moving means.

In the present embodiment, the same reference numerals are used to denote the same or equivalent members shown in the foregoing embodiments. The construction of a focused ion beam apparatus according to the present embodiment other than the above-mentioned construction is the same as that of the apparatus shown in FIG. 4.

With the aperture device 60 having the above construction, no positional error of an aperture 13 is generated, like the foregoing embodiments, when the size of the aperture 13 is changed. Accordingly, it is possible to change the size of the aperture 13 rapidly.

EMBODIMENT 4

Figure 10:
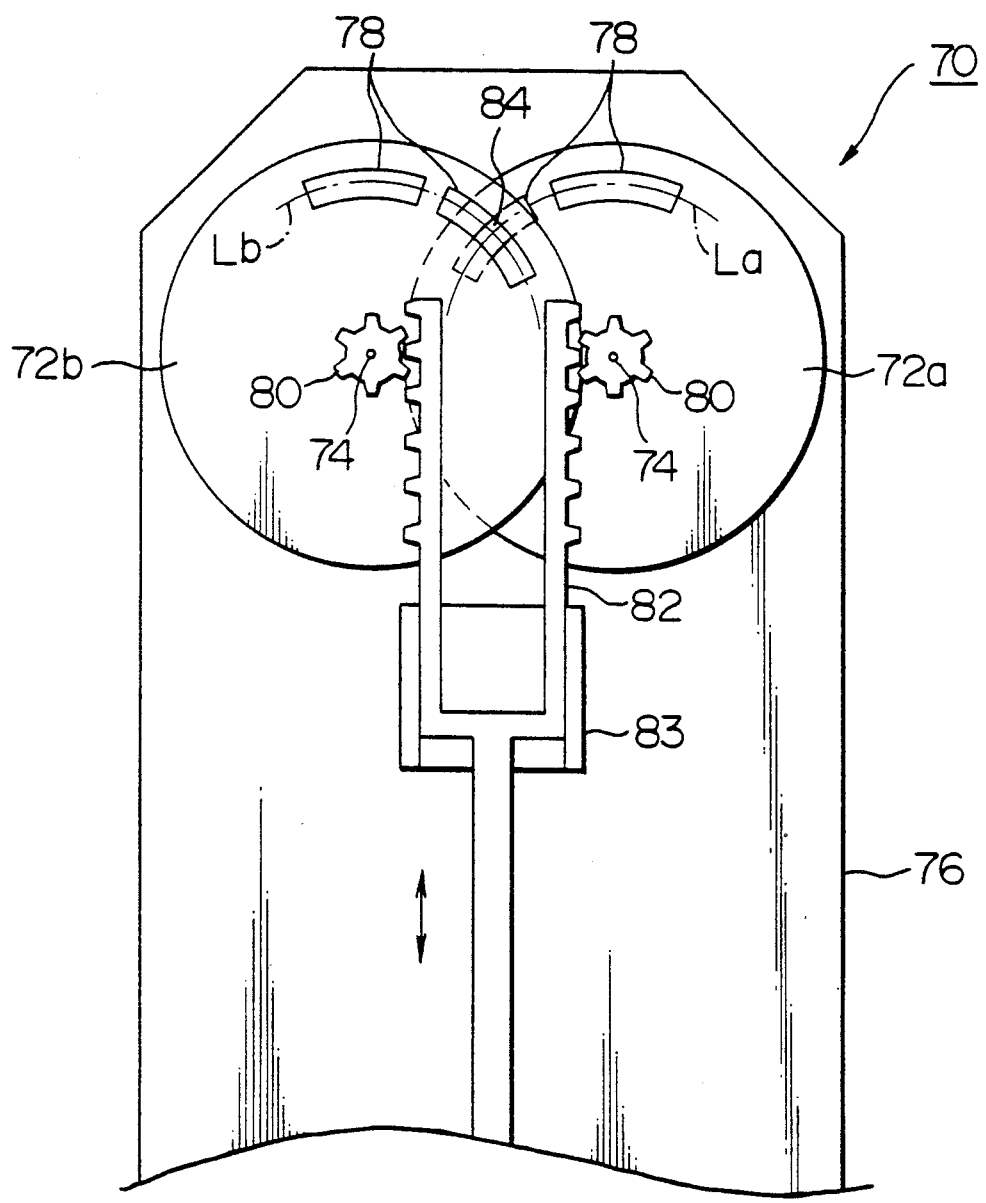
FIG. 10 is a view for explaining the construction of an aperture device which is applied to a fourth embodiment of the present invention.

FIG. 10 is a plan view of an aperture device 70 which is applied to a beam apparatus according to a fourth embodiment of the present invention.

In the aperture device 70 of the present embodiment, disks are used as slit plates 72a and 72b. Rotating shafts 74 are respectively passed through the centers of the disk-like slit plates 72a and 72b and are rotatably attached to a supporting plate 76. Each of the disk-like slit plates 72a and 72b includes slits 78 formed at an equal distance form the center of their slit plate. Namely, the slits 78 are formed on virtual trajectories La and Lb on circumferences concentric with the disk-like slit plates 72a and 72b. The slits 78 are designed as explained in conjunction with the first embodiment.

The rotating shafts 74 are provided with pinions 80 meshing with a rack 82. The rack 82 is coupled to the cam 19 shown in FIGS. 7 and 8 and moves in a direction shown by the vertical arrow in FIG. 10. As the rack 82 moves, the slit plates 72a and 72b rotate. Reference numeral 83 designates a guide for guiding the rack 82. The supporting plate 76 is coupled to the fine adjustment mechanism 30.

In the aperture device 70 of the present embodiment, the slit plates 72a and 72b move with the virtual trajectories La and Lb thereof always intersecting the beam. By elongating the slits 78 along the virtual trajectories La and Lb, namely, slits 78 are arranged in a longitudinal direction thereof, the position and size of an aperture 84 can be kept constant even if there are errors in the distances of movement of the slit plates 72a and 72b along the virtual trajectories La and Lb, that is, the angles of rotation thereof.

Figure 11A:
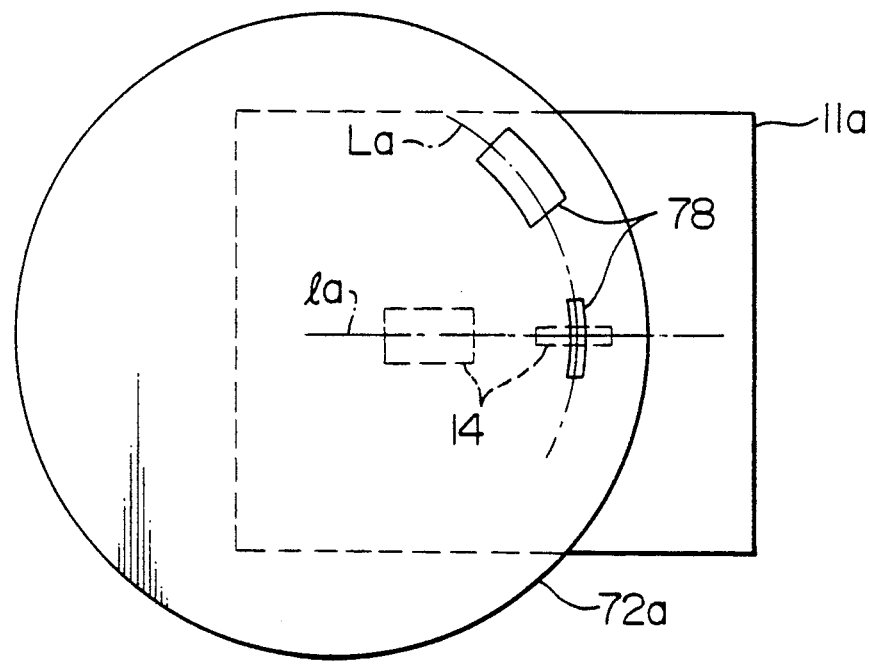
FIGS. 11a and 11b are plan views for explaining the combination of different types of slit plates.
Figure 11B:
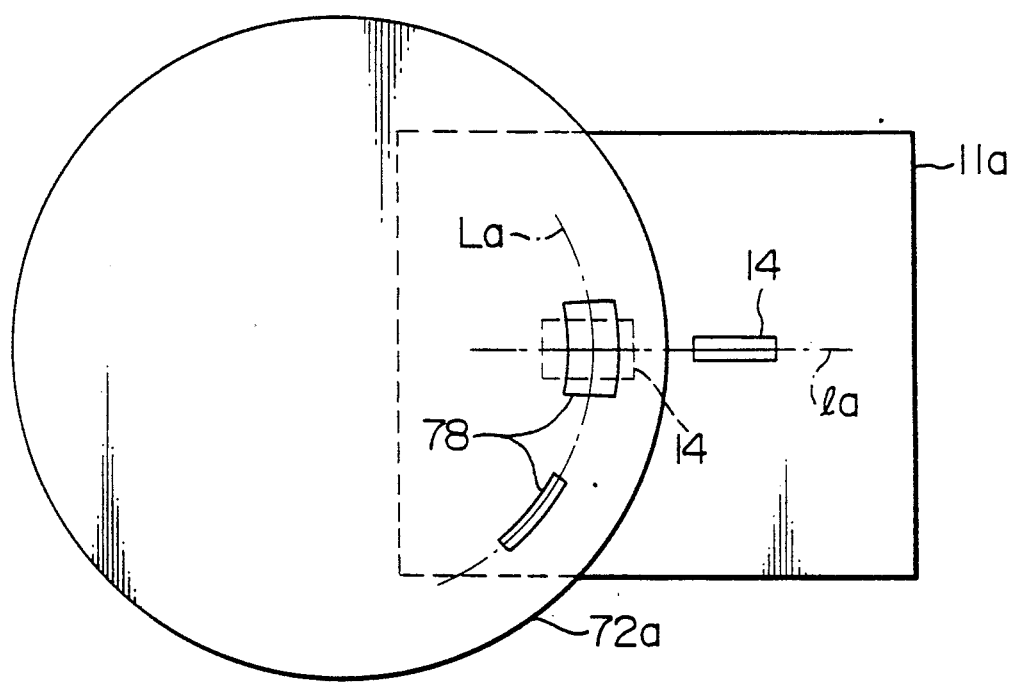

In the present embodiment, the slit plates 72a and 72b may be supported by individual supporting plates as in FIG. 9 with rack-and-pinion mechanisms being provided individually. Further, fine adjustment mechanisms may be coupled to the individual supporting plates, respectively. In the case where such a construction is employed, it is possible to combine a slit plate 11a having a straight virtual trajectory la and a slit plate 72a having a curved virtual trajectory La, as shown in FIGS. 11A and 11B.

Also, in the embodiment shown in FIG. 10, a step motor or a Geneva movement may be coupled to the rotating shafts 74 in order to intermittently rotate the slit plates 72a and 72b.

We claim:

1. A charged particle beam apparatus for irradiating a specimen with a beam of charged particles, comprising:
   a charged particle source;
   an optical system for focusing and deflecting charged particles emitted from said charged particle source to irradiate any given position on the specimen with a focused charged particle beam;
   a specimen stage for holding the specimen thereon and providing a small movement to the specimen;
   a plurality of slit plates superimposed in a direction of the axis of said beam, each of said plurality of slit plates including a plurality of slits, each slit having substantially parallel opposed long sides extending equidistant from a virtual trajectory direction line, and the slits of each plate having predetermined different widths between the opposed long sides and the same width as corresponding slits of the other of said slit plates; and
   slit plate moving means for moving said slit plates along the virtual trajectory direction lines of their slits with the the virtual trajectory direction lines of the slits of said slit plates intersecting each other and the beam, and for stopping the moving of said slit plates so that corresponding ones of the slits in said slit plates overlap to form an aperture that controls the beam.

2. A charged particle beam apparatus according to claim 1, wherein the slits in each of said slit plates are formed discretely.

3. A charged particle beam apparatus according to claim 1, wherein the slits in each of said slit plates are formed contiguously.

4. A charged particle beam apparatus according to claim 1, wherein the slits in each of said slit plates are arranged on a straight line.

5. A charged particle beam apparatus according to claim 4, wherein each of said slit plates is moved along a guide parallel to the longitudinal direction of the slits in that slit plate.

6. A charged particle beam apparatus according to claim 4, wherein said charged particle source, said optical system, said specimen stage and said slit plate moving means are disposed within a vacuum vessel, and said slit plate moving means includes:
   supporting means protruded from said vacuum vessel toward an inner side thereof;
   two approximately orthogonal guide means fixedly attached to said supporting means, said slit plates being respectively mounted on said two guide means with the virtual trajectory direction lines of the slits being parallel to the guide means so that each of said slit plates is moved in only the virtual trajectory direction of the slits;
   slit plate pushing means having a portion abutting against said slit plates, said abutting portion being moved in the longitudinal direction of the slits by a cam mechanism; and
   energizing means for biasing said slit plates to the abutting portion of said slit pushing means.

7. A charged particle beam apparatus according to claim 6, further comprising fine adjustment means for providing a small movement to a position of said supporting means in a virtual plane containing said virtual trajectory direction lines and approximately orthogonal to the axis of the beam.

8. a charged particle beam apparatus according to claim 4, wherein said charged particle source, said optical system, said specimen stage and said slit plate moving means are disposed within a vacuum vessel, and a plurality of said slit plate moving means are provided corresponding to said plurality of slit plates and are respectively supported by individual supporting means protruded from said vacuum vessel toward an inner side thereof.

9. A charged particle beam apparatus according to claim 4, wherein said charged particle source, said optical system, said specimen stage and said slit plate moving means are disposed within a vacuum vessel, and said slit plate moving means includes:

two supporting means protruded from said vacuum vessel toward an inner side thereof;

approximately orthogonal guide means fixedly attached to said two supporting means, respectively, said slit plates being respectively attached to said guide means with the virtual trajectory direction lines of the slits being parallel to the guide means so that each of said slit plates is moved in only the virtual trajectory direction of the slits; and first moving means for moving each of said slit plates in a direction of arrangement of the slits in that slit plate.

10. A charged particle mean apparatus according to claim 9, further comprising second moving means for moving a position of each of said two supporting means in a plane approximately orthogonal to the axis of said beam.

11. A charged particle beam apparatus according to claim 1, further comprising fine adjustment means for providing a small movement to positions of said slit plates in a virtual plane containing said virtual trajectory direction lines and approximately orthogonal to the axis of the beam.

12. A charged particle beam apparatus according to claim 1, wherein the slits of each of said slit plates are arranged on a virtual circle and said slit plate moving means moves each of said slit plates around the center of said virtual circle.

13. A charged particle beam apparatus according to claim 12, wherein rotating shafts are respectively provided at the centers of rotation of said slit plates and said slit plate moving means includes pinions which are formed on respective outer peripheries of said rotating shafts and a rack meshing with said pinions.

14. A charged particle beam apparatus according to claim 1, wherein the slits in at least one of said slit plates are arranged on a straight line and the slits in each of the remaining slit plates are arranged on a virtual circle.

15. a charged particle beam apparatus according to claim 1, wherein the corresponding slits in said slit plates approximately orthogonally overlap to form the aperture.

16. A charge particle beam apparatus according to claim 1, wherein said slit plate moving means has inherent positional tolerance error in stopping the movement of slit plates and the length of the opposed long sides is sufficiently greater than the sides of the aperture so that the size of the aperture is determined by only the width of the slits independently of the tolerance error.

17. A charge particle beam apparatus according to claim 16, wherein said plate moving means guides said plate so that any movement error appears only in the virtual trajectory direction of the slit of the plate being moved.

18. A charge particle beam apparatus according to claim 16, wherein the length of the opposed long sides is within 2 to 40 times the width of the slit formed by the long side.

19. A. charge particle beam apparatus according to claim 1, wherein the aperture is symmetrical with respect to an axis of the beam.

20. A charged particle beam apparatus according to claim 1, wherein said charged particle source, said optical system, said specimen stage and said slit plate moving means are disposed within a vacuum vessel, and a plurality of said slit plate moving means are provided corresponding to said plurality of slit plates and are respectively supported by individual supporting means protruded from said vacuum vessel toward an inner side thereof; and said slit plate moving means has inherent positional tolerance error in stopping the movement of slit plates and the length of the opposed long sides is sufficiently greater than the sides of the aperture so that the size of the aperture is determined by only the width of the slits independently of the tolerance error.

21. A charge particle beam apparatus according to claim 20, wherein said plate moving means guides said plate so that any movement error appears only in the virtual trajectory direction of the slit of the plate being moved; and the aperture is symmetrical with respect to an axis of the beam.

22. A charge particle beam apparatus according to claim 21, wherein the length of the opposed long sides is within 2 to 40 times the width of the slit formed by the long side.

23. A method of controlling a beam current of a beam of charged particles emitted from a charged particle source, comprising the steps of:

superimposing, a plurality of slit plates, each including a plurality of slits arranged in a virtual trajectory direction of that slit plate, and each slit having substantially parallel opposed long sides extending equidistant from a virtual trajectory direction line and the slits of each plate having predetermined different widths between the opposed long sides and the same width as corresponding slits of the other of said slit plates;

moving each of said slit plates in its virtual trajectory direction while keeping the virtual trajectory direction lines intersecting each other and said beam; and stopping the moving of said slit plates when corresponding ones of the slits in said slit plates overlap to form an aperture thereby controlling said beam current.

24. A method according to claim 23, wherein the slits in each of said slit plates on a straight line.

25. A method according to claim 23, wherein the slits in each of said slit plates are arranged on a virtual circle.

26. A method according to claim 23, wherein a direction of movement of each of said slit plates is defined by a guide parallel to the virtual trajectory direction of the slits in that slit plate.

27. A method according to claim 23, wherein the corresponding slits in said slit plates orthogonally overlap to form the aperture.

28. A method according to claim 23, further including controlling the diameter of the beam by said steps of moving and stopping.

29. A method according to claim 23, further including controlling the spread angle of the beam on a specimen by said steps of moving and stopping; and analyzing the specimen by detecting secondary electrons emitted from the specimen in response to the beam irradiating the specimen.

30. A method according to claim 29, further including controlling the diameter of the beam by said steps of moving and stopping.

31. A method according to claim 23, further including forming the slits with widths less than 1 mm.

* * * * *